(12) United States Patent
Risbo

(10) Patent No.: US 7,378,904 B2
(45) Date of Patent: *May 27, 2008

(54) SOFT TRANSITIONS BETWEEN MUTED AND UNMUTED STATES IN CLASS D AUDIO AMPLIFIERS

(75) Inventor: Lars Risbo, Copenhagen (DK)

(73) Assignee: Texas Instruments Incorporated, Dallas, TX (US)

( * ) Notice: Subject to any disclaimer, the term of this patent is extended or adjusted under 35 U.S.C. 154(b) by 433 days.

This patent is subject to a terminal disclaimer.

(21) Appl. No.: 10/962,848

(22) Filed: Oct. 12, 2004

(65) Prior Publication Data

US 2005/0083115 A1 Apr. 21, 2005

Related U.S. Application Data

(60) Provisional application No. 60/511,743, filed on Oct. 15, 2003.

(51) Int. Cl.
*H03F 3/38* (2006.01)
(52) U.S. Cl. ..................... 330/10; 330/207 A
(58) Field of Classification Search ............. 330/10, 330/207 A, 251
See application file for complete search history.

(56) References Cited

U.S. PATENT DOCUMENTS 6,563,377 B2 * 5/2003 Butler .................. 330/10
6,720,825 B2 4/2004 Hansen et al.
2004/0017854 A1 1/2004 Hansen et al.

* cited by examiner

*Primary Examiner*—Khanh Van Nguyen
(74) *Attorney, Agent, or Firm*—Wade J. Brady, III; Frederick J. Telecky, Jr.

(57) ABSTRACT

A class AD audio amplifier system (10) with reduced noise capability in muting and unmuting events is disclosed. The amplifier system (10) includes multiple audio channels (20), each of which can be constructed to include a pulse-width-modulator (PWM) (24). The PWM modulator (24) includes a pair of comparators (39A, 39B; 52+, 52−) that generate complementary PWM output signals based upon the comparison between a filtered difference signal and a reference waveform. When the system is muted, a common mode voltage (CM_RAMP) is applied to the inputs of the comparators (39A, 39B; 52+ 52−) to suppress the duty cycle at the amplifier output, preferably to a zero duty cycle. In the transition from a muted state to an unmuted state, the common mode voltage (CM_RAMP) is ramped from the suppressing voltage to zero common mode voltage, permitting the duty cycle of the complementary PWM signals to gradually increase, thus reducing clicks and pops. The converse operation is performed in the transition from unmuted to muted. Pulse-width-modulation control logic (26) is also included to ensure that that the PWM "on" and "off" pulses are of at least a minimum duration, and also to generate compensating pulses on the complementary PWM line at low duty cycles.

28 Claims, 5 Drawing Sheets

SOFT TRANSITIONS BETWEEN MUTED AND UNMUTED STATES IN CLASS D AUDIO AMPLIFIERS

CROSS-REFERENCE TO RELATED APPLICATIONS

This application claims priority, under 35 U.S.C. §119(e), of Provisional Application No. 60/511,743, filed Oct. 15, 2003.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to pulse-width modulated class D audio power amplifiers.

As is fundamental in the art, electronic amplifier circuits are often classified in various "classes". For example, the output drive transistors of class A amplifier circuits conduct DC current even with no audio signal, and the entire output voltage swing is of a single polarity. Class B amplifiers, on the other hand, typically include complementary output drive transistors, driving an output voltage swing including both positive and negative polarity excursions. Class B amplifiers are necessarily more efficient, because both complementary output drive transistors are never on at the same time. Class AB amplifiers maintain a small bias current through complementary output drive transistors, so that the output voltage swing is centered slightly above (or below) ground voltage. While the non-zero bias current renders class AB amplifiers theoretically less efficient than class B amplifiers, class AB amplifiers present avoid the crossover distortion of class B amplifiers.

In recent years, digital signal processing techniques have become prevalent in many electronic systems. The fidelity provided by digital techniques has increased dramatically with the switching speed of digital circuits. In audio applications, the switching rates of modern digital signal processing are sufficiently fast that digital techniques have become widely accepted for audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD or plasma televisions. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

FIG. 1 illustrates the architecture of a conventional class D audio amplifier, specifically a so-called "class AD" audio amplifier with a bridged load. In this conventional audio implementation, audio speaker SPKR is the load, and is bridged between pairs of output transistors 7A, 7C; 7B, 7D. Feedback from the output is also used to generate a negative feedback signal via feedback unit 9. In this architecture, input analog signal IN is received at one end of adder 11, along with this negative feedback signal. Adder 11 presents a difference signal between the input IN and the feedback signal to loop filter 13, which applies transfer function H(s) that establishes the stability of the system and also the extent to which error is suppressed by the feedback loop. The filtered difference signal from loop filter 13 is applied to an input of natural sampling pulse width modulator 1.

Conventional pulse width modulator 1 includes comparator 5, which compares its input signal from loop filter 13 with a triangle wave generated by signal source 3, and applied to the negative input of comparator 5. The triangle waveform is at a period T and a switching frequency $F_{sw}$, as shown. In this example, in which the load SPKR is bridged between output drive transistors, comparator 5 generates complementary, two-level, pulse-width-modulated (PWM) output signals. Referring to the positive output from comparator 5, which is applied to output transistors 7A and 7D, the output signal is at an amplitude of +1 (turning on transistors 7A, 7D) responsive to the filtered input difference signal being instantaneously higher than the current state of the triangle waveform, and at an amplitude of −1 (turning off transistors 7A, 7D) responsive to this input signal instantaneously being lower than the current state of the triangle waveform. The negative output of comparator 5 produces a complementary output signal, turning on and off transistors 7B, 7C. It is known to include some sort of gating or synchronization between the complementary output signals to ensure that both output drive stages are not on at the same time, thus ensuring that "crowbar" current is not drawn.

This conventional amplifier circuit is often referred to as a class "AD" amplifier arrangement, in that a zero input signal (i.e., zero difference signal between input signal IN and the feedback signal, as filtered by loop filter 13) will produce a 50% duty cycle output drive across load SPKR. This class AD arrangement is effected by transistors 7A, 7D being turned on while transistors 7B, 7C are off, so that current flows from left-to-right through load SPKR in one half-cycle, and so that transistors 7B, 7C are on while transistors 7A, 7D are off in the other half-cycle, during which current flows from right-to-left through load SPKR. In this arrangement, the common mode voltage across the bridged load SPKR is zero volts.

By way of further background, other class D amplifier arrangements are also known in the art. One such arrangement is referred to as the class "BD" amplifier, by way of analogy to class B analog amplifiers. In the class BD amplifier, the bridged load is driven by separate modulators. As a result, there are three possible drive states across the bridged load: full positive polarity, full negative polarity, and zero volts. As a result, for zero input signal, no output PWM signals appear at all (i.e., there is zero output, or the PWM output is at a "zero" state).

Class D amplifiers have become attractive for audio applications, especially as the desired output power levels have increased over recent years. The efficiency of class D amplifiers in driving loudspeakers can be higher than 90%, which is much higher than the efficiency provided by conventional analog audio amplifiers. Among other benefits of this improved efficiency, the heat that is dissipated in the drive circuitry is much reduced, and thus the amplifier heat sinks can be much smaller (and thereby lighter). Class D audio amplifiers have thus become quite popular for portable and automotive audio systems.

However, a particular problem in class D audio amplifiers is presented by the transient events of muting and un-muting of the audio system. As is fundamental in the art, a steady-state square wave time-domain signal (corresponding to a 50% duty cycle PWM signal) transforms into the frequency domain as discrete frequency components at the fundamental "carrier" frequency and its harmonics. It has been observed that if the PWM signal is abruptly gated on or off or otherwise abruptly changes its duty cycle, however, significant energy is present in sidebands to the carrier frequency and its harmonics. And even if the fundamental frequency is relatively high, the abrupt gating on or off of the PWM signal can result in sidebands with significant energy that extend into audible frequencies, which manifest as audible "clicks" or "pops". In audio systems, this gating on and off of the PWM output occurs when the user mutes or unmutes the audio output, and at power-up and power-down, in which case the audible clicks and pops are very undesirable.

In conventional analog non-switching amplifiers, clicks and pops in the audio output are reduced by smoothing the change in biasing, for example at power-up. However, these smooth biasing changes cannot be directly applied in class D amplifiers, because of the switching operations of the output transistors. According to another conventional approach, clicks and pops are reduced by introducing a switch or relay that disconnects the load during mode changes, thus eliminating transients from appearing at the load; however, the insertion and control of such a switch or relay has proven to be cost-prohibitive, especially in modern systems.

Considering that class D audio amplifiers effectively operate in the digital realm, and also considering that many sources of audio input signals are also digital in nature (e.g., compact discs, MP3 and other digitally compressed music files, satellite radio), many modern audio systems are fully digital, in that they receive digital input signals and produce digital, PWM, class D amplifier output. In these fully digital systems, digital signal processing techniques for suppressing clicks and pops are known. Examples of these digital techniques are described in U.S. Pat. No. 6,720,825 and in U.S. Patent Application Publication No. US 2004/0017854, assigned to Texas Instruments Incorporated and incorporated herein by this reference.

However, analog-input audio systems with class D amplifier output remain important and numerous, such systems including conventional radios and especially car radios. Car radios are also vulnerable to other complexities, such as the need to operate reliably over a wide range of power supply voltages (e.g., battery or alternator voltages ranging from about 8 volts to about 20 volts), which effectively eliminate the ability to control transients through the use of precise and stable regulated voltages. These constraints complicate the design of high-performance automotive audio systems.

By way of further background, copending application Ser. No. 10/846,281, filed May 14, 2004, entitled "Improved Loop Filter for Class D Amplifiers", commonly assigned with this application and incorporated herein by reference, describes a class D amplifier circuit in which the open-loop error for audio band frequencies is improved by a loop filter that has multiple feedback loop paths.

BRIEF SUMMARY OF THE INVENTION

It is therefore an object of this invention to provide a class D audio amplifier in which audible clicks and pops are reduced.

It is a further object of this invention to provide such an amplifier in which the clicking and popping is greatly reduced when muting and unmuting the audio amplifier.

It is a further object of this invention to provide such an amplifier in which the normal operation of the audio amplifier is not affected by the click and pop reduction circuitry.

It is a further object of this invention to provide such an amplifier in which minimum on and off pulses are controlled to avoid instability of operation.

It is a further object of this invention to provide such an amplifier in which audible clicks and pops upon muting and unmuting are further reduced even upon stepping from zero duty cycle to guaranteed minimum pulse width pulses.

Other objects and advantages of this invention will be apparent to those of ordinary skill in the art having reference to the following specification together with its drawings.

The present invention may be implemented into a class D audio amplifier in which a common mode voltage is applied to the modulator input to suppress the pulse widths of the pulse width modulated output when the output is muted. Preferably, the common mode voltage is ramped from a level of zero additional voltage (normal operation) to a suppressing voltage (muted) when muting is applied, and ramped from the suppressing voltage to zero additional voltage when the amplifier is unmated. In this manner, muting and unmuting of the audio amplifier is "softened", which greatly reduces the energy that appears in audible frequencies.

According to another aspect of the invention, minimum pulse widths for "on" and "off" pulses are controlled in the pulse-width modulated class D audio amplifier, especially in effecting the "soft" starts and stops of the audio output in the unmuting and muting operations. In addition, circuitry is provided so that each short pulse of a given polarity also generates a compensating pulse of the opposite polarity, so that the pulses serve to cancel one another in the time domain, and thus further reduce audible sideband noise.

DETAILED DESCRIPTION OF THE INVENTION

The present invention will be described in connection with its preferred embodiment, namely as implemented into an audio system, such as an automobile sound system, as it is contemplated that this invention is especially beneficial in such an application. However, it is also contemplated that this invention will be beneficial in many other applications in which class D amplifiers, or pulse-width-modulators, are applicable. Accordingly, it is to be understood that the following description is provided by way of example only, and is not intended to limit the true scope of this invention as claimed.

Figure 2:
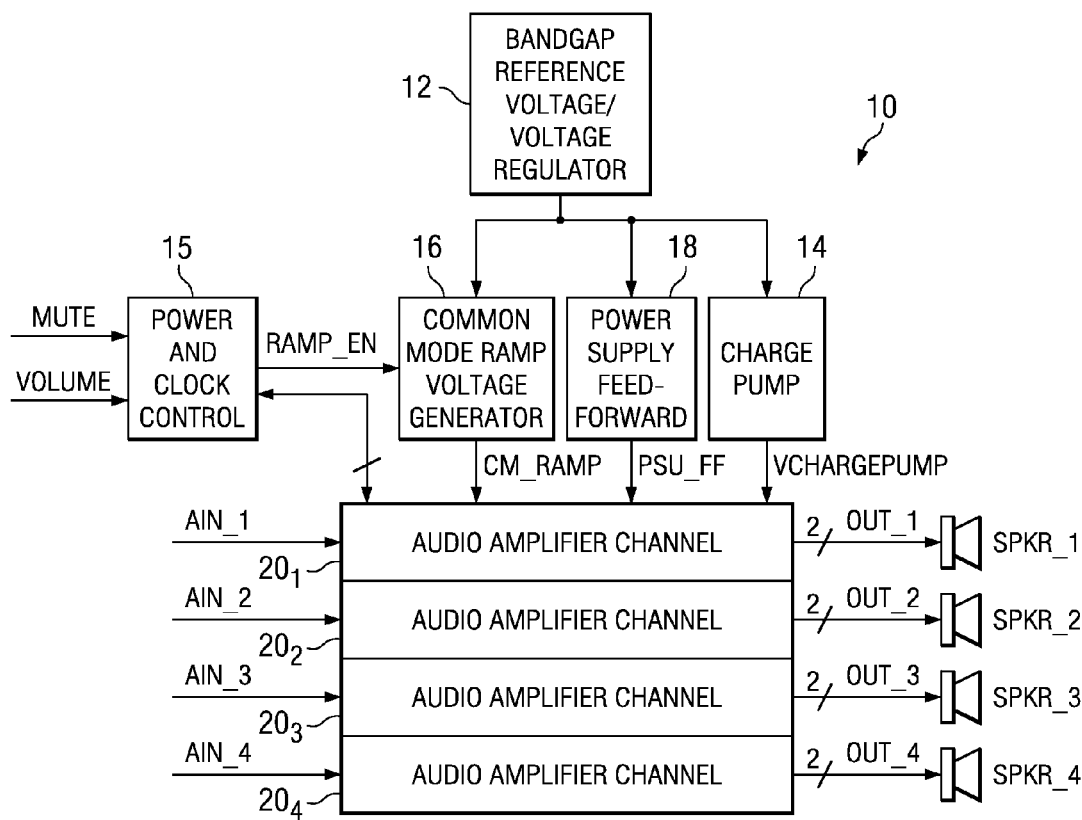
FIG. 2 is an electrical diagram, in block form, of a digital audio amplifier system constructed according to the preferred embodiment of the invention.

FIG. 2 illustrates the construction of digital audio amplifier system 10 constructed according to the preferred embodiment of the invention. In this example, system 10 is capable of driving four output audio channels from four separate analog inputs. It is, of course, contemplated that system 10 may drive more or fewer channels, depending upon the system requirements and specifications. In this example, therefore, four analog input signals AIN_1 through AIN_4 are received at the inputs of audio amplifier channels $20_1$ through $20_4$, respectively. Audio amplifier channels $20_1$ through $20_4$ in turn drive class D output signals OUT_1 through OUT_4, respectively, which drive respective ones of speakers SPKR_1 through SPKR_4. In this embodiment of the invention, speakers SPKR_1 through SPKR_4_ are bridged loads to audio amplifier channels $20_1$ through $20_4$, and as such output signals OUT_1 through OUT_4 include two signals, one from each of two half-bridge outputs for each channel $20_1$ through $20_4$. The combination of the half-bridges applying the output to speakers SPKR_1 through SPKR_4 is often referred to as an "H-bridge", as known in the art. In this specific example, as will become apparent from the following description, audio amplifier channels $20_1$ through $20_4$ are constructed to have class AD output drive characteristics, in which case the output signals OUT_1 through OUT_4 each include complementary output signals from the two half-bridge outputs.

Various control circuitry is also included within system 10 according to this embodiment of the invention. Power and clock control circuitry 15 provides the conventional control functions for digital audio system 10, such functions, including overvoltage and undervoltage detection and protection, detection and control related to other faults in the operation of system 10, clock circuitry for generating the various clock signals used by system 10 and, according to this invention, receipt and processing of mute signal MUTE. Voltage regulator circuit 12, which may include a bandgap or other reference voltage generator circuit, a conventional voltage regulator circuit, or both, provides regulated power supply and regulated reference voltages to the various other functions in system 10, and also to audio amplifier channels 20, in the conventional manner. Charge pump 14 is a conventional charge pump circuit that provides the appropriate voltages to gate drive circuits in the half-bridge outputs of audio amplifier channels 20.

Power supply feed-forward circuit 18 is also preferably provided in system 10. As known in the class D amplifier art, the gain of an H-bridge is proportional to the power supply voltage, while the gate of a pulse-width-modulator is inversely proportional to the amplitude of the reference waveform (e.g., a triangle or sawtooth reference waveform). As a result, the loop gain (i.e., the product of the H-bridge and PWM gains) can undesirably vary with variations in the power supply voltage, causing potential loop stability problems and the introduction of undesired signal modulation. To compensate for this effect, as known in the art, power supply feed-forward circuit 18 forwards the same power supply voltage used to set the amplitude of the reference waveform as the power supply voltage that biases the half-bridge output circuits of audio amplifier channels 20. In this way, any variations in this power supply voltage will appear both at the reference waveform amplitude and also at the output, in which case the loop gain will effectively remain constant over these variations.

According to this preferred embodiment of the invention, system 10 also includes common mode ramp voltage generator circuit 16. As will become more apparent from the following description, common mode ramp voltage generator circuit 16 generates a ramp voltage that is applied to the input of the pulse-width-modulator, along with the reference waveform and the input signal, during transient times following the muting or unmuting of the audio output from system 10, and applies a common mode voltage while system 10 is muted. The ramp voltage suppresses the pulse widths of the output signals, and thus provides a "soft" transitions at the audio output when muting or unmuting. As a result, undesired sideband energy at audible frequencies that otherwise results from the abrupt gating on or off of the class D, or PWM, output signals is greatly reduced, eliminating the "clicks" and "pops" that conventionally occur when muting or unmuting the audio output. Common mode ramp voltage generator circuit 16 may be constructed as a conventional ramp circuit for generating a voltage that ramps over time between selected voltages, for example in response to a control signal on line RAMP_EN that is generated by power and clock control circuit 15 in response to a transition in its received control signal MUTE, indicating either that the audio output is to be muted or unmated. It is contemplated that those skilled in the art will be readily able to construct an appropriate circuit for common mode ramp voltage generator 16, given the desired functionality for this circuit as described in this specification.

Figure 3:
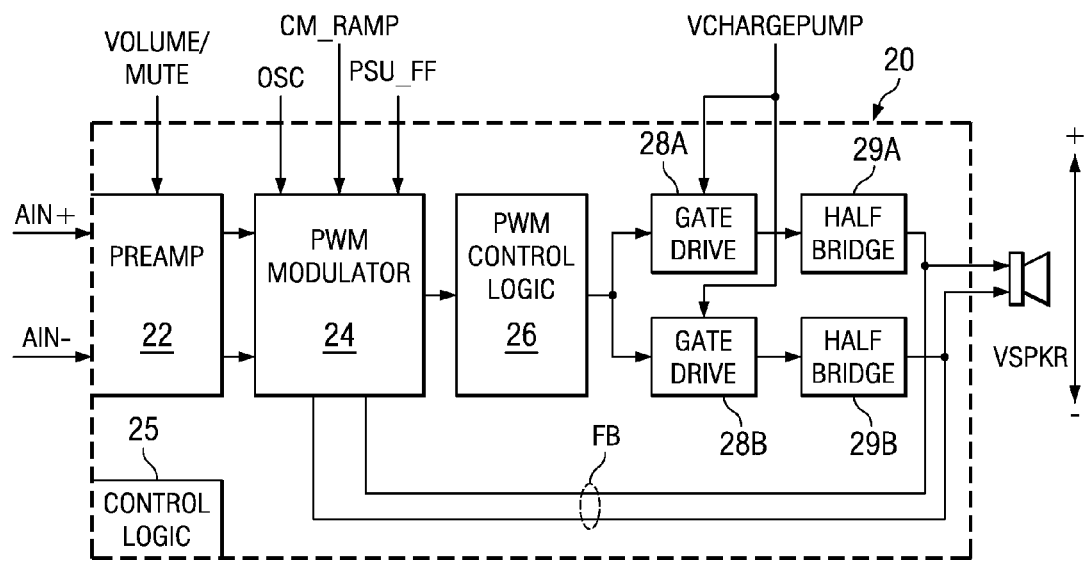
FIG. 3 is an electrical diagram, in block form, of the audio amplifier for an output channel in the digital audio amplifier system of FIG. 2, constructed according to the preferred embodiment of the invention.

Referring now to FIG. 3, the construction of one of audio amplifier channels 20 will now be described in further detail. It is of course contemplated that each of audio amplifier channels $20_1$ through $20_4$ in system 10 will be constructed identically as one another, corresponding to the construction of channel 20 as shown in FIG. 3. Of course, the particular construction of one or more of channels 20 may vary from that shown in FIG. 3, if appropriate for a particular application.

Differential analog input signals AIN+, AIN− are received by audio amplifier channel 20 at preamplifier 22. As will become more apparent from the following description, it is contemplated that audio amplifier channel 20 will typically be implemented in a fully differential fashion, as reflected by the differential analog input signals AIN+, AIN−. However, audio amplifier channel 20 may alternatively be implemented in single-ended fashion if desired, in which case the analog audio input signal would be a single-ended signal (or converted from a differential signal to a single-ended signal within channel 20). It is contemplated that those skilled in the art will be readily able to construct audio amplifier channels 20 in either differential or single-ended arrangements, as desired. The generalized construction of channel 20 illustrated in FIG. 3 is intended to be applicable to either implementation.

Preamplifier 22 includes a preamplifier for amplifying the analog input level for application to PWM modulator 24, to an amplification level corresponding to volume and mute control signal VOLUME/MUTE from power and clock control circuit 15 (FIG. 2), which is in response to a user input. For muting and unmuting of the audio output, of course, the volume and mute control signal effectively gates the output of preamplifer 22 to a zero output level in a muted condition, or to the desired volume output in an unmuted condition. One example of the construction of preamplifier 22 is described in copending application Ser. No. 10/836,067 filed Apr. 30, 2004, commonly assigned herewith and incorporated herein by this reference.

The output of preamplifier 22 is then applied to PWM modulator 24, along with a feedback signal on lines FB. PWM modulator 24 receives a reference waveform on line OSC, from a local oscillator in power and clock control circuit 15, according to which it effects the pulse-width-modulation used to generate the class D output signals. Also, in this embodiment of the invention, PWM modulator 24 receives the common mode ramp voltage on line CM_RAMP from common mode ramp voltage generator 16. The common mode voltage on line CM_RAMP is a non-zero common mode voltage during muting periods, and is a ramped common mode voltage in transient periods following mute and unmute events, as will be described in further detail below. PWM modulator 24 also receives a power supply level on line PSU_FF from power supply feed-forward circuit 18.

PWM modulator 24 generates a pulse-width-modulated output (either single-ended, or preferably differential) to PWM control logic 26, according to this embodiment of the invention. As will be described in further detail below, PWM control logic 26 modifies the PWM output from modulator 24 in response to certain events. According to this preferred embodiment of the invention as will be described in further detail below, PWM control logic 26 will enforce certain minimum pulse widths for both the "on" and "off" pulses during the transient periods following a mute or unmute of the audio output in which the common mode ramp voltage on line CM_RAMP affects the duty cycle of the PWM modulated output, thus ensuring stable operation of channel 20. In addition, PWM control logic 26, according to this preferred embodiment of the invention, also generates compensating "cross-feed" complementary pulses to further reduce audible sideband energy in these transitions, as will also be described in further detail below.

Figure 1:
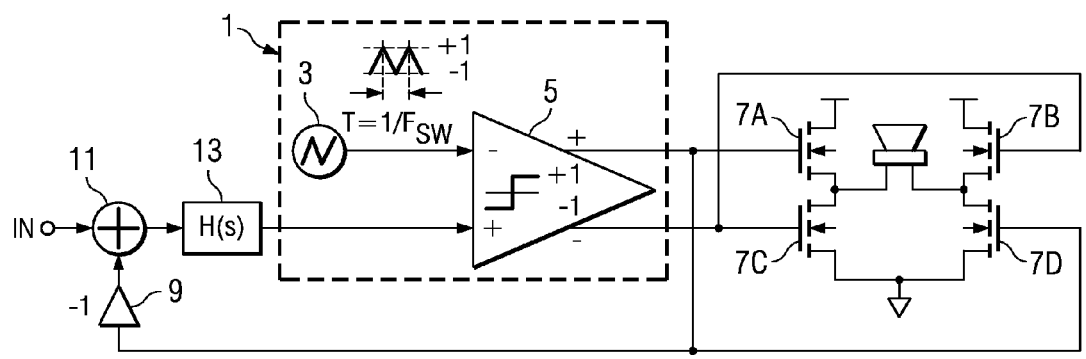
FIG. 1 is an electrical diagram, in schematic form, of a conventional class AD audio amplifier system.

According to this embodiment of the invention, in which audio amplifier channel 20 operates as a class AD amplifier, PWM control logic 26 issues complementary output signals to gate drivers 28A, 28B. Gate drivers 28A, 28B each generate the appropriate output levels to drive the gates of transistors in half-bridges 29A, 29B, respectively. These output levels are controlled by voltage VCHARGEPUMP from charge pump 14 (FIG. 2), in the conventional manner. Half bridges 29A, 29B each include the appropriate power output transistors for driving speaker SPKR in response to the PWM output signal. For example, half-bridge 29A may include a pull-up transistor and a pull-down transistor connected on opposite sides of speaker SPKR to drive current of one polarity when on, similarly as transistors 7A, 7D of FIG. 1. Half-bridge 29B includes opposing pull-up and pull-down transistors driving speaker SPKR with current of the opposite polarity when on, similarly as transistors 7B, 7C of FIG. 1. In this arrangement, each of half-bridges 29A, 29B receive complementary output signals from PWM control logic 26, so that the transistors of half-bridge 29A are on when the transistors of half-bridge 29B are off, and vice versa. In this manner, speaker SPKR is driven as a bridged load, in class AD fashion. The signals driven by half-bridges 29A, 29B are also fed back to PWM modulator 24 on lines FB, for application to the modulation process as will be described below.

Figure 4:
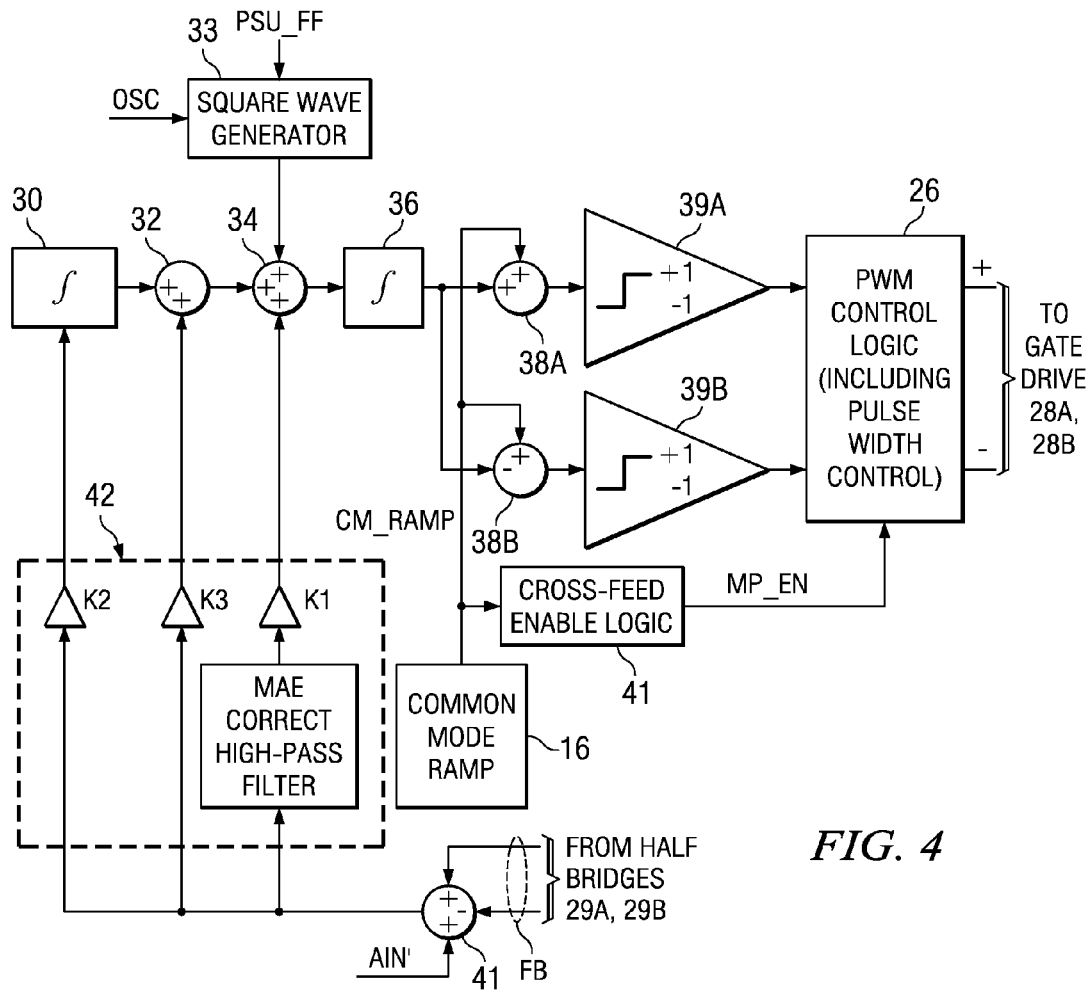
FIG. 4 is an electrical diagram, in block form, of modulator circuitry in an audio channel of the digital audio amplifier system of FIG. 2, constructed according to the preferred embodiment of the invention.

Referring now to FIG. 4, the construction of PWM modulator 24 will now be described, in its operable combination with PWM control logic 26. Analog input signal AIN', which corresponds to the output of preamplifier 22 (FIG. 3), is received at adder 41. Adder 41 also receives a feedback signal FB from half-bridges 29A, 29B, in the form of a differential voltage driven across load SPKR. The output of adder 41, corresponding to the difference between the input signal AIN' and the feedback signal FB is applied to loop filter block 40. According to this embodiment of the invention, loop filter block 40 applies filters and gains to this difference signal. As described in further detail in copending application Ser. No. 10/846,281, filed May 14, 2004, commonly assigned herewith and incorporated herein by this reference, the PWM modulator loop filter preferably includes at least one loop path with a transfer function of second order or higher, and at least one loop path in which the maximum negative slope of the magnitude versus frequency for frequencies below the switching frequency is lower than the negative slope of its real part at frequencies above the switching frequency. In the example shown in FIG. 4, the loop filter is realized as a single loop filter involving the combination of loop filter block 40 with first and second integrators 30, 36. As such, the loop filter in this exemplary implementation is a second-order filter, although it is of course contemplated that the loop filter may be of a higher order, or even a first order filter if desired. In this case, the multiple loop paths preferably operate upon the feedback signal on lines FB from half-bridges 29A, 29B so that the loop filter suppresses distortion from half-bridges 29A, 29B; alternatively, the feedback signal may be derived from the output of PWM control logic 26, or from the output of gate drives 28. Further in the alternative, the loop filter of modulator 24 can be implemented in the conventional manner.

In any event, according to the example of FIG. 4, first integrator 30 receives a filtered difference signal corresponding to the difference between an input signal corresponding to the desired audio output and feedback from the current audio output. First integrator 30 integrates this difference and forwards the result to a sequence of adders 32, 34. Adder 32 adds in another feedback term from loop filter block 40 to the integrated difference from first integrator 30. Adder 34 receives the output of adder 32, adds in another feedback term from loop filter block 40 (preferably including a high-pass filter, as described in copending application Ser. No. 10/846,281), and also adds the reference waveform from square wave generator 33; the sum from the output of adder 34 is then integrated by second integrator 36.

In this embodiment of the invention, the PWM reference waveform is generated by square wave generator 33 in response to a periodic signal presented on line OSC from power and clock control circuit 15 (FIG. 2), having an amplitude corresponding to a voltage communicated on line PSU_FF from power supply feed-forward circuit 18 (FIG. 2). As fundamental in the PWM art, a pulse-width-modulated signal is generally produced from the difference between a periodic sawtooth or triangle waveform and the difference signal. Because the output of adder 34 is applied to second integrator 36 in this embodiment of the invention (and considering that the integral of a square wave is a triangle wave), the reference waveform in this example is applied as a square wave. In addition, because this reference waveform is periodic, it can be either added to or subtracted from the difference signal from adder 32, assuming no DC offset in the reference waveform. And even if DC offset is present in the reference waveform, first integrator 30 will integrate out any resulting DC error, because the reference waveform is injected after first integrator 30.

According to the preferred embodiment of this invention, as shown in FIG. 4, the outputs of second integrator 36 are applied to a pair of adders 38A, 38B. Adder 38A adds one output of integrator 36, corresponding to the signal to be applied to half-bridge 29A, to the common mode ramp voltage on line CM_RAMP, while adder 38B subtracts the output of integrator 36 corresponding to the signal to be applied to half-bridge 29B, from the common mode voltage on line CM_RAMP. The output of adder 38A is applied to comparator 39A, which generates a pulse-width-modulated signal of one polarity, while the output of adder 38B is applied to comparator 39B, which generates a complementary PWM signal relative to that of comparator 39A. These PWM output signals, which correspond to the output signals to be applied to half-bridges 29A, 29B, are then applied to PWM control logic 26, which ensures minimum pulse widths as will be described in further detail below.

Figure 5:
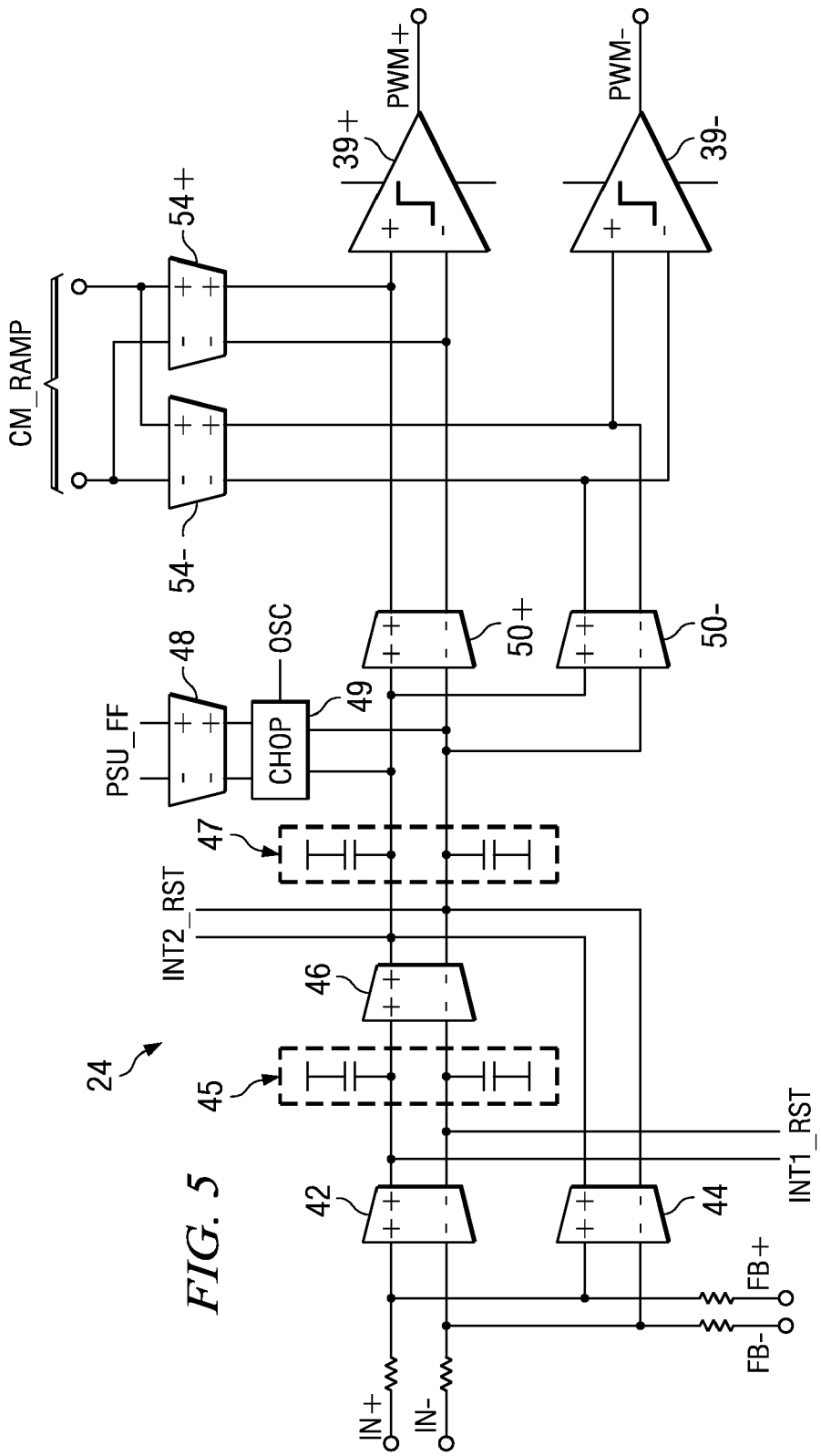
FIG. 5 is an electrical diagram, in schematic form, of a differential implementation of the modulator circuitry of FIG. 4, according to a preferred embodiment of the invention.

FIG. 5 illustrates the construction of PWM modulator 24 according to a fully differential implementation, which is preferred for many applications. Of course, given the functional description of PWM modulator 24 as provided above relative to FIG. 4, it is contemplated that those skilled in the art will be readily able to implement PWM modulator 24 according to other implementations, including a single-ended signal implementation. However, for ease of implementation and also stability of operation, the fully differential implementation of FIG. 5 is preferred, according to this preferred embodiment of the invention.

As shown in FIG. 5, the differential input signal is received on lines IN+, IN− from preamplifier 22, and is applied to the positive and negative inputs of differential operational transconductance amplifier (OTA) 42. OTA 42 may be constructed according to conventional techniques, and as is also known in the art, produces a differential current output in response to the differential voltage received at its input. According to this embodiment of the invention, a differential feedback signal from loop filter block 40 (FIG. 3) is received on lines FB+, FB−, and is applied to the negative and positive inputs of OTA 42, respectively. Because the polarity of the feedback signal on lines FB+, FB− is reversed from that of input signal IN+, IN− as applied to OTA 42, the differential input voltage applied to OTA 42 corresponds to the difference between the input signal and the feedback signal, and thus OTA 42 generates a differential current that corresponds to an error value (i.e., the difference between the desired output, as represented by the differential input voltage, and the current output, as represented by the differential feedback signal).

The output of OTA 42 is applied to first integrator 45. Because the difference signal at the output of OTA 42 is a differential current, first integrator 45 is implemented by way of a pair of capacitors, each connected between one of the outputs of differential OTA 42 and a reference voltage, thus producing a differential voltage (the voltage across the integrating capacitors corresponding to the integral of the charging current over time). This integrated difference current, in the form of a differential voltage, is applied to the differential input of OTA 46, which produces a differential current at its output that corresponds to the integration of the difference current from OTA 42. The output of OTA 46 is applied to second integrator 47, which is also implemented by way of parallel capacitors coupled to the differential output lines from OTA 46.

As mentioned above, the loop filter of PWM modulator 24 in this preferred embodiment of the invention, as described in detail in copending application Ser. No. 10/846,281, involves multiple feedback loop paths. As such, OTA 44 receives a differential voltage corresponding to the difference between the input voltage (IN+, IN−) and the feedback voltage (FB+, FB−), and applies a differential current to second integrator 47, along with the integrated difference current produced by OTA 46. Because two integrators 45, 47 are included in PWM modulator 24, the loop filter of PWM modulator 24 is second-order; as mentioned above, it is contemplated that PWM modulator 24 may alternatively be constructed to have a higher order loop filter, or even a first-order characteristic, if desired.

According to this preferred embodiment of the invention, reset signals INT1_RST, INT2_RST are applied to first and second integrators 45, 47, respectively. These reset signals effectively discharge first and second integrators 45, 47 upon power-up or some other event in which the PWM outputs are expected to be quite different from, and have no relation to, the input signal. In this way, the previous condition of PWM modulator 24 is removed, reducing the latency in PWM modulator 24 in reaching the appropriate desired output state after reset.

The pulse-width-modulation reference signal is also applied to the summing node at second integrator 47. According to this embodiment of the invention, feed-forward power supply voltage PSU_FF is applied, as a differential voltage signal, to OTA 48, which in turn generates a differential current corresponding to the desired amplitude of the reference waveform. Chop circuit 49 chops this differential current from OTA 48 at a frequency determined by a periodic signal received on line OSC from power and clock control circuitry 15 (FIG. 2). The output of chop circuit 49, therefore, is a differential current in the form of a square wave, at the frequency defined by the signal on line OSC, and at an amplitude that corresponds to the feed-forward power supply voltage PSU_FF. This differential square wave current is applied to the summing nodes at second integrator 47, along with the sum of the output of OTA 46 and the feedback signal from OTA 44.

The summed currents that are integrated by second integrator 47 to a differential voltage are applied to differential inputs of OTA 50+ and OTA 50−. OTA 50+ generates a differential current at its positive and negative outputs that is applied to the positive and negative inputs, respectively, of comparator 52+. Conversely, OTA 50− generates a differential current at its positive and negative outputs that is applied to the negative and positive inputs, respectively, of comparator 52−. Comparators 52+, 52− are conventional differential comparators, for comparing the level at its input against a reference level, and generating a full-scale output level on its output lines PWM+, PWM−, respectively. Considering that OTAs 50+, 50− receive the same inputs as one another, and that comparators 52+, 52− have their inputs connected to the differential outputs of OTAs 50+, 50− in reverse polarity relative to one another, the outputs of comparators 52+, 52− will be logical complements of one another.

According to this preferred embodiment of the invention, a differential common mode ramp voltage CM_RAMP is generated by common mode ramp voltage generator 16 (FIG. 2), and applied to differential inputs of OTAs 54+, 54−. OTAs 54 generate differential currents at their outputs, corresponding to the differential voltage at their inputs. In this embodiment of the invention, the differential outputs of OTA 54+ and OTA 54− are applied to the differential inputs of comparator 52+ and comparator 52− in positive polarity (positive and negative OTA outputs connected to positive and negative comparator inputs, respectively). As mentioned above, however, the output of OTA 50− is applied to the input of comparator 52− with reverse polarity.

In steady-state normal operation, a differential analog input voltage from preamplifier 22 is received at OTAs 42, 44, along with a differential feedback voltage from loop filter 40. The difference current at the output of OTA 42 is integrated by first integrator 45, and applied to OTA 46, which generates a differential current corresponding to the integration of the difference current from OTA 42. This integrated difference current is summed with second-order feedback from OTA 44, and with the reference waveform, in the form of a square wave of differential current from chop circuit 48 at the frequency of the signal on line OSC. Those skilled in the art will recognize that, for purposes of pulse-width-modulation, the addition of a differential periodic waveform to a differential signal that is time-varying at a much lower frequency than the periodic waveform, with both signals at the same DC level (e.g., ground) results in a summed signal that is equivalent to the difference signal that would result if the signals were subtracted from one another. In effect, a 180° phase shift in the much higher-frequency reference waveform would not substantially change the resulting signal.

The signal at the summing nodes at the output of OTA 46 is integrated by second integrator 47, and the resulting differential voltage is applied to OTAs 50+, 50−, which generate differential currents that are substantially identical to one another. With the common mode ramp voltage at lines CM_RAMP at zero, the output of OTA 50+ is applied to comparator 52+. Considering the above description, the output of OTA 50+ is a differential current that follows a voltage that corresponds to the integral of a second-order difference signal, as compared with a periodic reference signal. This differential current is a periodically varying signal, of both polarities. Comparator 52+ thus generates a pulse-width-modulated output signal at a fundamental frequency set by the reference waveform frequency at line OSC, and that is at a high level during the time that the output of OTA 50+ is above a reference level such as ground and at a low level during the time that the output of OTA 50+ is below that reference level. According to this embodiment of the invention, if the input signal IN+, IN− is significantly higher than the feedback signal FB+, FB−, a large difference current will propagate through PWM modulator 24, and will cause a pulse-width-modulated signal of a duty cycle higher than 50% at the output of comparator 52+ on line PWM+.

Conversely, comparator 52− has its input cross-coupled to the differential output of OTA 50−, and as such generates a pulse-width-modulated signal at line PWM− that is complementary relative to the signal at line PWM+ at the output of comparator 52+. In the example where the input signal IN+, IN− is significantly higher than the feedback signal FB+, FB−, the large positive polarity difference current will cause a pulse-width-modulated signal at duty cycle less than 50%, at the output of comparator 52− on line PWM−. And, in class AD fashion, a zero level input signal will, in the steady state, result in complementary PWM signals on lines PWM+, PWM− that are both at a 50% duty cycle.

Referring now to FIGS. 6a through 6d, the operation of PWM modulator 24 in audio amplifier 20 in system 10 according to this preferred embodiment of the invention, specifically in the manner in which clicks and pops in the audible output are eliminated by the application of the common mode voltage when muted, and by the ramping of this common mode voltage during muting and unmuting transients, will now be described.

Figure 6A:
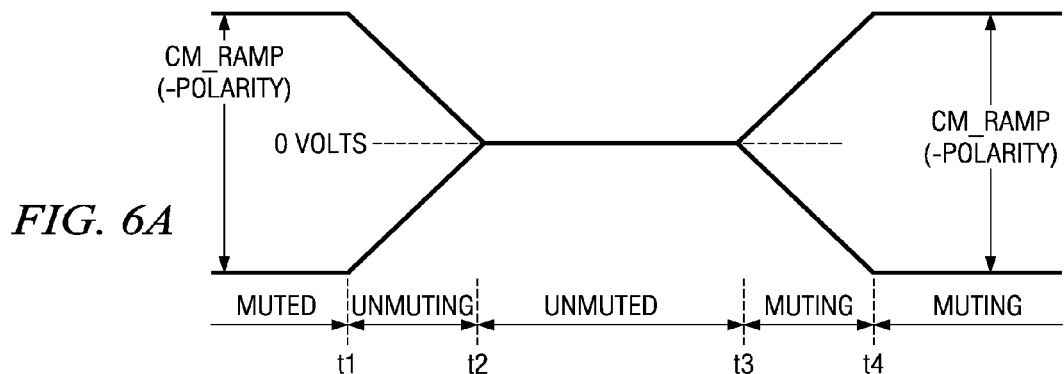
FIGS. 6a through 6d are timing diagrams illustrating the operation of the modulator circuitry of FIGS. 4 and 5 in muting and unmuting its output according to the preferred embodiment of the invention.
Figure 6B:
Figure 6C:

FIG. 6a illustrates relative levels of the differential voltage CM_RAMP according to the preferred embodiment of the invention. Prior to time t1, PWM modulator 24 is in a muted mode. This muting is applied by way of the volume and mute control signal VOLUME/MUTE to preamplifer 22, forcing the output of preamplifier 22 to a zeroed output signal to PWM modulator 24 (i.e., the differential voltage across input lines IN+, IN− at zero volts). According to this preferred embodiment of the invention, common mode ramp voltage generator 16 applies a differential voltage CM_RAMP, of a substantial negative polarity, during muting. Referring back to FIG. 5, this negative differential voltage CM_RAMP during mute places a significant bias at the input to comparator 52+, ensuring that the duty cycle of the output of comparator 52+ on line PWM+ will be zero at all times when channel 20 is muted. This negative differential voltage similarly biases the input to comparator 52−, ensuring that the output of comparator 52−, on line PWM−, will also be at a zero duty cycle. FIG. 6b illustrates the component signals at the input of comparator 52+, in which waveform REF is the reference waveform, formed in this example as the integral of the square wave output from chop circuit 49, at the reference frequency defined by the signal on line OSC, and in which waveform CM_RAMP(−) is the signal corresponding to the output of common mode voltage generator 16 as applied to the input of comparator 52+. In this example of FIG. 6b, it is contemplated that the output of preamplifier 22 that contributes to the pulse-width-modulated output from comparator 52+ is zero, which is the case during muting. In the conventional manner, the output of comparator 52+ is forced to a low level output. As evident from FIG. 6b, during this muting time prior to time t1, the negative bias of common mode voltage CM_RAMP causes the reference waveform REF to be at a higher level than common mode voltage CM_RAMP at all times in each cycle. FIG. 6c illustrates the component signals at the input of comparator 52−, but in which waveform CM_RAMP(+) is the output of common mode voltage generator 16 as applied to the input of comparator 52−.

Figure 6D:
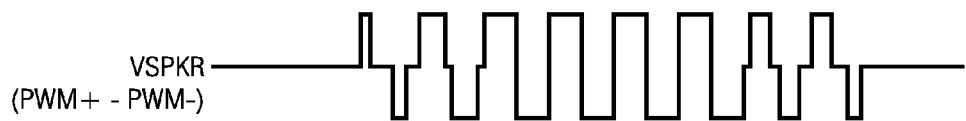

Therefore, prior to time t1 in this muted condition, according to this embodiment of the invention, the common mode voltage CM_RAMP in FIG. 6a forces the duty cycle at the output of comparator 52+ to zero. FIG. 6d illustrates the voltage VSPKR across the speaker SPKR, which corresponds to the voltage difference between the PWM outputs PWM+ and PWM− at comparators 52+, 52−. In this muted state, therefore, no pulses are applied across the load of speaker SPKR during muting.

At time t1, unmuting of system 10 begins, typically in response to a user input. According to this preferred embodiment of the invention, common mode voltage ramp generator 16 begins to gradually reduce its output voltage CM_RAMP, at a rate of change that can be readily selected by the skilled artisan having reference to this specification.

The negative differential bias of decreasing amplitude of voltage CM_RAMP that is applied to the inputs of comparators 52+, 52− during this unmuting transient period from time t1 to time t2, in this example, permits the pulse widths at outputs PWM+, PWM− to gradually increase from zero. It is contemplated that the frequency of reference waveform REF and thus the frequency of the pulses of voltage VSPKR will typically be much higher, relative to the ramping of voltage CM_RAMP, than that suggested by FIGS. 6a through 6d; the relatively long periods of these signals are illustrated for the sake of clarity of this description. At any rate, as shown in FIG. 6b, the voltage CM_RAMP exceeds the level of the reference waveform REF at comparator 52+ (and comparator 52−) for increasing portions of each cycle, which results in increasingly longer positive and negative pulses across voltage VSPKR. But because there is a non-zero common mode voltage applied to the inputs of comparators 52+, 52−, the signals on lines PWM+, PWM− are not complementary to one another.

By time t2, the unmuting transient is completed, and common mode voltage CM_RAMP has reached zero volts, as evident from FIG. 6a. System 10 is thus in its normal, unmuted, operating mode, so that the analog input signals applied to each of its channels 20 determine the audio output from those channels. In this state, where the common mode voltage applied to comparators 52+, 52− is zero volts, the pulse-width-modulated outputs of comparators 52+, 52− are exactly complementary to one another. In the example of FIGS. 6b and 6c, in which the analog audio input signal is zero (for purposes of this description), comparators 52+, 52− each generate 50% duty cycle pulses at their outputs, which are complementary to one another, as evident from the 50% duty cycle square wave load voltage VSPKR as shown in FIG. 6d. Of course, any analog input voltage will be reflected as variations in this 50% duty cycle pulse train, to drive speaker SPKR in response to that audio input, in standard class AD fashion.

At time t3, system 10 is again muted, typically in response to a user input. According to this embodiment of the invention, common mode voltage CM_RAMP begins ramping from zero volts to a negative differential, reversing the unmuting process between times t3 and t4. This ramping of common mode voltage CM_RAMP begins reducing the duty cycle at the output of each of comparators 52+, 52−, with the presence of a non-zero common mode voltage causing the outputs on lines PWM+, PWM− to no longer be exactly complementary to one another. This ramping continues, and the output duty cycle decreases, until time t4 at which time full muting is in effect, and common mode voltage CM_RAMP is at its full muted level. Preamplifier 22 may have its output suppressed by the volume and mute control signal VOLUME/MUTE. This muting state continues until unmuting is effected by the user, in which case the common mode voltage CM_RAMP begins its transition back to zero volts, as described above beginning with time t1.

According to this preferred embodiment of the invention, therefore, clicks and pops at the output are greatly reduced, if not eliminated. In the transition time following a muting or unmuting command, the duty cycles decrease or increase smoothly, as a result of the ramping of the common mode voltage applied to the PWM comparators 52. This soft change is in stark contrast to the immediate transitions that occur in conventional class AD audio amplifiers upon muting and unmuting events.

The reduction in the audible clicks and pops attained by this invention can be understood by considering the reduction in the wideband energy generated by muting and unmuting in the PWM modulator 24 according to this preferred embodiment of the invention. Those skilled in the art will recognize that the wideband energy of a periodic square wave (i.e., the energy in the frequency domain sidebands about the fundamental frequency) is proportional to the pulse width of the periodic square wave. As mentioned above, the zero input signal state of a class AD audio amplifier is a 50% duty cycle square wave; as such, instantaneous transitions to and from a different duty cycle than this 50% duty cycle (such as will occur upon muting and unmuting) results in significant energy coupling to these sidebands. According to this invention, in contrast, the duty cycle smoothly transitions to and from a minimum (including zero) duty cycle state upon muting and unmuting. As a result, the energy that couples into sidebands within the audible frequency band is greatly reduced according to this invention. Clicks and pops upon muting and unmuting of the audio output are thus greatly reduced in amplitude, if not eliminated.

Referring back to FIG. 5, first and second integrators 45, 47 can be reset by the application of discharging levels on lines INT1_RST, INT2_RST, respectively. According to the preferred embodiment of the invention, this resetting of integrators 45, 47 is preferably performed during muting, so that undesired transients upon unmuting are avoided. In contrast, if a residual voltage remained at the capacitors in integrators 45, 47, this residual would become part of the feedback signal as unmuting began, and could couple energy into audible frequency sidebands, causing clicks and pops.

It has also been discovered, according to this invention and referring back to FIG. 4, that the PWM loop filter also assists in the elimination of wideband energy on transition of the audio amplifier to an unmuted state. As fundamental in PWM channels such as channel 20 of FIG. 4, loop filter block 40 applies the current state of the PWM output level to integrators 45, 47, thus affecting the output signals. According to this invention, as the PWM duty cycle begins increasing from a muted state toward the unmuted state (e.g., from time t1 to time t2 of FIGS. 6a through 6d), channel 24 is able to responsively change its output with increasing effect as the PWM duty cycle increases. In this manner, loop filter 40 and the feedback operation of channel 24 further reduces the energy that couples into audible sidebands. Conversely, however, in the muting process (e.g., from time t3 to time t4 of FIGS. 6a through 6d), the duty cycle at the output is decreasing, and is thus less effective in feedback control.

Referring back to FIG. 4, the outputs of comparators 39A, 39B (i.e., differential comparators 52+, 52− in the example of FIG. 5), are applied to PWM control logic 26. As described above, the common mode voltage CM_RAMP that is applied to the inputs of comparators 39A, 39B causes the duty cycle at their output to be very short, as shown in FIG. 6d. It has been observed, according to this invention, that extremely short pulse width active levels applied to gate drive 28A, 28B can cause instability in the operation of system 10. According to another aspect of this invention, as will now be described beginning with FIG. 7, PWM control logic 26 ensures that both on and off states driven by gate drive 28A, 28B are of a minimum guaranteed pulse width, to avoid the potential for instability.

Figure 7:
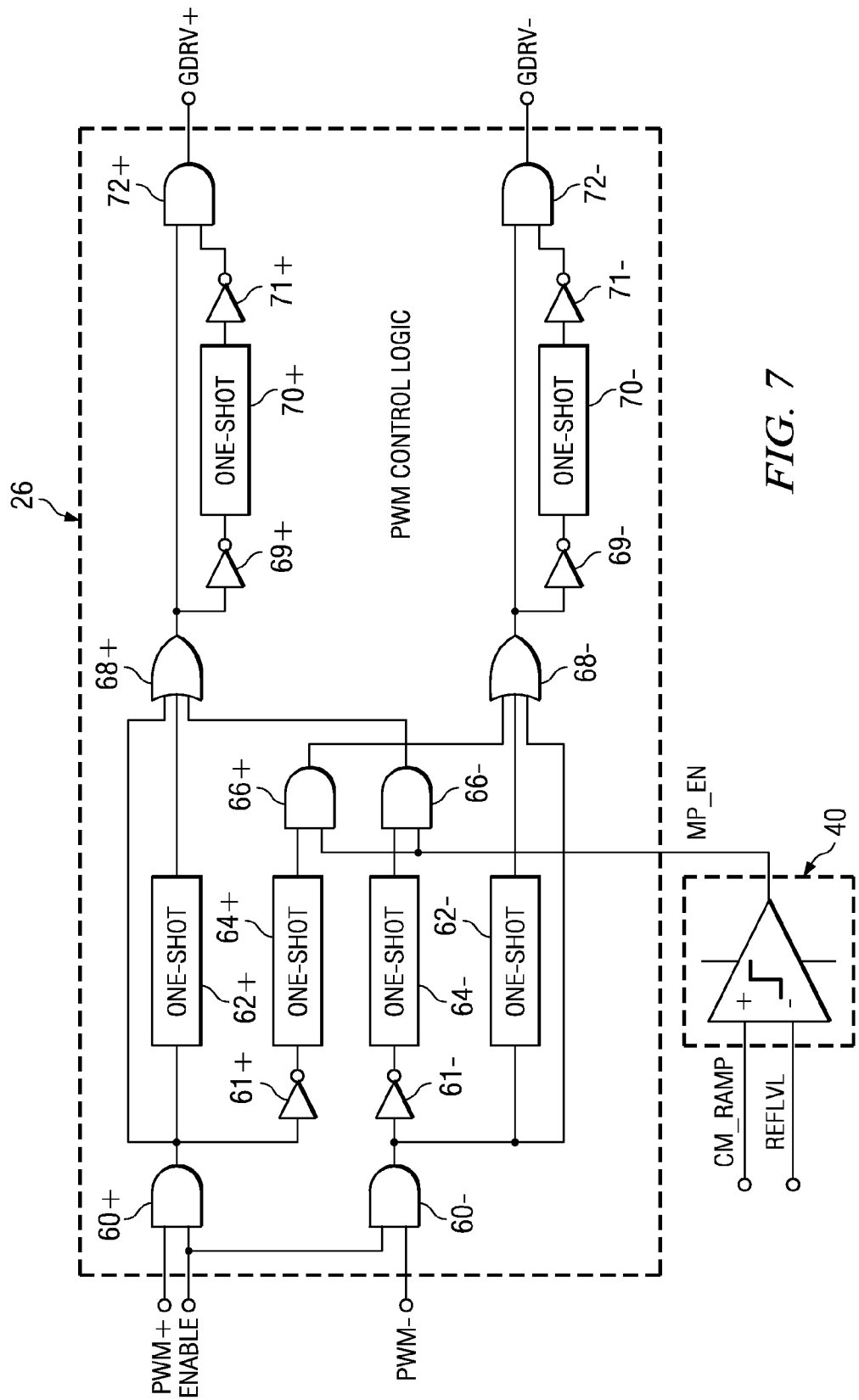
FIG. 7 is an electrical diagram, in schematic form, of pulse-width-modulation control logic in the audio channel of the digital audio amplifier system of FIG. 2, constructed according to the preferred embodiment of the invention.

As shown in FIG. 7, pulse-width-modulated signals are communicated to PWM control logic 26 from comparators 39A, 39B on lines PWM+, PWM−, respectively. Line PWM+ is connected to one input of AND gate 60+, and line PWM− is connected to one input of AND gate 60−; each of AND gates 60+, 60− also receive an enable signal on line ENABLE, preferably from power and clock control circuit 15. As such, AND gates 60+, 60− permit the enabling and disabling of PWL control logic 26, and thus the enabling and disabling of audio output from channel 20.

The output of AND gate 60+ is connected to a first input of OR gate 68+, and to an input of one-shot multivibrator 62+. The output of one-shot multivibrator 62+ is connected to a second input of OR gate 68+. A third input of OR gate 68+ is connected to the output of AND gate 66− for cross-feeding, as will be described in further detail below. The output of OR gate 68+, which presents an "on" pulse of guaranteed minimum pulse width, is forwarded to circuitry for ensuring an "off" pulse of guaranteed minimum pulse width. Specifically, the output of OR gate 68+ is forwarded to one input of AND gate 72+, and via inverter 69+ to one-shot multivibrator 70+. The output of one-shot multivibrator 70+ is coupled, via inverter 71+, to a second input of AND gate 72+. The output of AND gate 72+, at line GDRV+, drives gate drive 28A (FIG. 3), which in turn drives half-bridge 29A.

Similarly, the output of AND gate 60− is connected to a first input of OR gate 68−, to the input of one-shot multivibrator 62−. A second input of OR gate 68− receives the output of one-shot multivibrator 62−, and a third input of OR gate 68− receives the output of AND gate 66+, as will be described in further detail below. As in the case of OR gate 68+, OR gate 68− presents an "on" pulse of guaranteed minimum pulse width at its output, and is forwarded to one input of AND gate 72−, and to one-shot multivibrator 70− via inverter 69−. The output of one-shot multivibrator 70− is connected to inverter 71−, and the output of inverter 71− is applied to a second input of AND gate 72−. The combination of AND gate 72−, and one-shot multivibrator 70−, ensures a guaranteed minimum "off" pulse, as will become apparent below. The output of AND gate 72− on line GDRV− drives gate drive 28B (FIG. 3), which in turn drives half-bridge 29B.

As mentioned above, for stability and reliability of the audio amplifier channels 20, any pulses applied to gate drive circuits 28A, 28B are preferably controlled to have a guaranteed minimum pulse width, so that half-bridges 29A, 29B are not placed into indeterminate states, especially those that can cause extremely high levels of "crowbar" current to be conducted through half-bridges 29A, 29B. But it has been observed, according to this invention, that the abrupt transition of the PWM outputs from zero duty cycle (during muting) to pulses having a guaranteed minimum pulse width can cause significant wideband energy, coupling into audible frequencies. It has been discovered, according to this invention, that the coupling of energy into audible sidebands can be further reduced by generating compensating pulses of opposite polarity to the minimum pulse width PWM pulse, as will now be described, again with reference to FIG. 7.

According to this preferred embodiment of the invention, PWM control logic 26 cross-feeds PWM pulses for one of half-bridges 29A, 29B to the other half-bridge 29B, 29A to generate a compensating pulse. As shown in FIG. 7, the output of AND gate 60+ is connected via inverter 61+ to the input of one-shot multivibrator 64+. The output of one-shot multivibrator 64+ is connected to an input of AND gate 66+. A second input of AND gate 66+ is driven by the output of cross-feed enable logic 41 (also shown in FIG. 4). As shown in FIG. 7, in this exemplary implementation, cross-feed enable logic 41 includes a comparator for comparing common mode ramp voltage CM_RAMP against a reference level REFLVL; in response to voltage CM_RAMP exceeding reference level REFLVL, cross-feed enable logic 41 applies an active high level on line MP_EN to AND gate 66+. The output of AND gate 66+ is connected to an input of OR gate 66−, thus cross-feeding pulses from the signal on line PWM+ to the opposite half-bridge via line GDRV− during the common mode ramp operation, as will be described in further detail below.

Conversely, the output of AND gate 60− is connected through inverter 61− to the input of one-shot multivibrator 64−. The output of one-shot multivibrator 64− is connected to an input of AND gate 66−, which receives line MP_EN at its second input. The output of AND gate 66− is cross-fed to a third input of OR gate 68+.

One-shot multivibrators 62, 64, 70 in PWM control logic 26 are conventional one-shot circuits, generating an active pulse of a selected duration when edge-triggered at its input. The output duration of each of one-shot multivibrators 62, 64, 70 depend on the particular requirements of a given audio channel 20. It is contemplated that those skilled in the art having reference to this specification, and the desired operation of a particular implementation, can readily select and realize the particular pulse duration and other attributes of one-shot multivibrators 62, 64, 70.

The operation of PWM control logic 26 according to this preferred embodiment of the invention, and including the operation of its cross-feeding pulse compensation, will now be described in further detail relative to FIGS. 7 and 8. For this example, it will be assumed that channel 20 is in a transition period between muting and unmuting (in either direction), and that as a result, common mode ramp voltage CM_RAMP is at a non-zero level that exceeds reference level REFLVL at cross-feed enable logic 41. As a result, an active high level will be driven by cross-feed enable logic 41 on line MP_EN, so that AND gates 66+, 66− will be controlled by the logic level at the output of corresponding one-shot multivibrators 64+, 64−.

Figure 8:
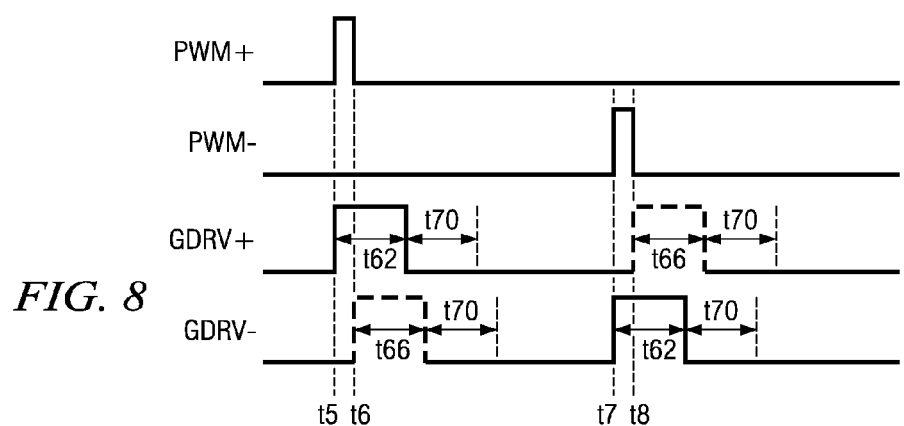
FIG. 8 is a timing diagram illustrating the operation of the pulse-width-modulation control logic of FIG. 7, according to the preferred embodiment of the invention.

At time t5 of FIG. 8, comparator 39A issues a positive-going pulse on line PWM+. This positive-polarity pulse passes through AND gate 60+ (line ENABLE being active high) to an input of OR gate 68+. This high level passes to an input of AND gate 72+ and, because the output of one-shot multivibrator 70+ is low (because the low-to-high transition at the output of OR gate 68+ does not cause a pulse at the output of one-shot multivibrator 70+ because of inverter 69+), the output of inverter 71+ at the second input of AND gate 72+ is also high. As such, the positive pulse on line PWM+ appears at line GDRV+, after the propagation delay of PWM control logic 26 through gates 60+, 68+, 72+ (not shown in FIG. 8).

As evident from FIG. 8, however, the pulse width of the active pulse on line PWM+ is very short. According to this preferred embodiment of the invention, however, the leading edge of this pulse causes one-shot multivibrator 62+ to issue a high level at its output, for a selected duration (duration t62 in this example). Through the operation of OR gate 68+, the duration of the output pulse from OR gate 68+ thus extends for the longer of the original pulse on line PWM+ or the duration t62 implemented by one-shot multivibrator 62+.

As mentioned above, PWM control logic 26 cross-feeds a compensating pulse to the opposite half-bridge, so that the overall energy applied to the load SPKR is reduced during the abrupt transition to or from a zero duty cycle and the minimum pulse width duty cycle enforced by PWM control logic. This cross-feeding is accomplished, with reference to FIG. 7, by the application of the output of AND gate 60+ to one-shot multivibrator 64+, via inverter 61+. Accordingly, upon the falling edge of the short pulse on line PWM+, at time t6 of FIG. 8, one-shot multivibrator 64+ issues an active high pulse at its output, for a selected duration t64. This high pulse from one-shot multivibrator 64+ passes through AND gate 66+ (line MP_EN_ being high), through OR gate 68− and AND gate 72− (because the output of one-shot multivibrator 70− is low, and is inverted by inverter 71− to a high level), and appears at line GDRV− for the duration t64 that is set by one-shot multivibrator 64+. As evident from a comparison of the pulses on lines GDRV+, GDRV− in FIG. 8, and considering that these pulses are applied, via gate drive 28A, 28B, to half-bridges 29A, 29B. Accordingly, the pulse on line GDRV− opposes the pulse on line GDRV+ and thus reduces the energy delivered to load SPKR as a result of the pulse on line PWM+. This compensating opposing pulse reduces the energy that is delivered to load SPKR as a result of the lengthened pulse width on line GDRV+ relative to that of the pulse on line PWM+ that was received by PWM logic 26. This compensates for the substantial transient in delivered energy between a zero duty cycle and the minimum duty cycle enforced by PWM logic 26.

Alternatively, inverters 61+, 61− may be eliminated, in which case the compensating pulse on line GDRV− will be initiated following the rising edge of the pulse on line PWM+ (rather than following the trailing edge as described above). It is contemplated that selection of the relationship between the compensating cross-feed pulse on line GDRV− to the active pulse on line PWM+ can be made by the skilled artisan, having reference to this specification, as optimized for a particular system application.

Following the end of the positive active pulse from line PWM+ or from one-shot multivibrator 62+, depending on which is longer, the output of AND gate 68+ falls low again. This high-to-low transition is inverted by inverter 69+, and causes one-shot multivibrator 70+ to issue a positive going pulse at its output, which is in turn inverted by inverter 71+ to present a blocking low level at one input of AND gate 72+. This low level blocks any transition at the output of OR gate 68+ within the duration t70 of one-shot multivibrator 70+ from appearing at the output on line GDRV+. In this way, a guaranteed minimum "off" time of the signal at line GDRV+ is enforced, with this minimum determined by the pulse width applied by one-shot multivibrator 70+.

As evident from FIG. 7 and the foregoing description, the converse operation of PWM control logic 26 occurs in response to a pulse on line PWM− from comparator 39B, as shown in FIG. 8 as beginning from time t7. The positive pulse on line PWM− passes through AND gate 60−, through OR gate 68− and AND gate 72−, and appears at line GDRV− as shown in FIG. 8. This pulse on line GDRV− continues for as long as one-shot multivibrator 62− maintains its output active high, in response to the leading edge of the pulse at line PWM−. The falling edge of the pulse on line PWM−, at time t8, is cross-fed to OR gate 68+ through the operation of one-shot multivibrator 64− (and inverter 61−). The active pulse at the output of OR gate 68+ causes AND gate 72+ to issue an active high pulse on line GDRV+, to compensate for the lengthened pulse on line GDRV− produced by PWM control logic 26 in response to the pulse on line PWM− from comparator 39B, that pulse having an extremely short pulse width (below the minimum duration set by one-shot multivibrator 62−) because of the level of common mode ramp voltage CM_RAMP in this embodiment of the invention.

And as in the case of the pulse on line GDRV+, upon the termination of the pulse on line GDRV−, the action of one-shot multivibrator 70− (and its inverters 69−, 71−) will ensure that line GDRV− remains low for a guaranteed time, namely the duration of one-shot multivibrator 70− as shown in FIG. 8.

Once common mode ramp voltage CM_RAMP reaches the selected level REFLVL, cross-feed enable logic 41 pulls line MP_EN low, blocking the cross-feed action of AND gates 66+, 66−. It is contemplated that this disabling of the cross-feed function occurs well prior to the end of the ramping of common mode ramp voltage CM_RAMP (i.e., well prior to times t2 and t4 of FIG. 6), which is contemplated to be near the time at which the pulse widths at lines PWM+, PWM− are reasonably long, and thus the transient energy will be substantially smoothed without requiring the compensating pulses.

This invention thus provides important advantages in the performance of class D pulse-width modulated amplifiers, especially when such amplifiers are implemented in audio systems. Audible clicks and pops in the audible frequency band are greatly reduced by the operation of the PWM modulators according to this invention, particularly in the class AD context, by the application of a common mode voltage to the modulating comparators during muting, and by smoothly ramping that common mode voltage during transitions between muting and unmuting events. As a result, the duty cycle of the PWM signals generated by the audio amplifiers are kept at or near zero in muting, and smoothly change toward a full 50% duty cycle (in class AD) during the transition. This smooth transition minimizes the coupling of wideband energy, which occurs upon abrupt transitions, into the audible band.

Stability of the audio amplifier system is also enforced by ensuring that "on" and "off" pulses have guaranteed minimum duration. But because the transition from zero duty cycle to this guaranteed minimum duration would also cause click and pop noise, another aspect of this invention cross-feeds PWM pulses during such transition periods, so that compensating pulses to the opposing half-bridge of the audio output are produced to negate the energy of the enforced guaranteed minimum pulses. As such, stability of the audio amplifier system is maintained, while reducing or even eliminating the clicks and pops due to abrupt operational changes.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An audio amplifier, comprising:
difference circuitry, for generating a difference signal responsive to an input signal and a feedback signal;
a first comparator, for generating first pulse-width-modulated output pulses responsive to a comparison of the difference signal and a periodic reference waveform;
a second comparator, for generating second pulse-width-modulated output pulses responsive to a comparison of the difference signal and a periodic reference waveform, the second pulse-width-modulated output pulses complementary to the first pulse-width-modulated output pulses;
a power stage, for driving an amplifier output responsive to the first and second pulse-width-modulated output pulses;

a loop filter for filtering a signal corresponding to the amplifier output to produce the feedback signal; and common mode ramp voltage circuitry, having an output coupled to inputs of the first and second comparators, for generating a common mode voltage of a first level in a muted mode, and for ramping the common mode voltage from the first level to a zero level responsive to a transition from the muted mode to an unmuted mode.

2. The amplifier of claim 1, wherein the common mode ramp voltage circuitry is also for ramping the common mode voltage from a zero level to the first level responsive to a transition from the unmuted mode to the muted mode.

3. The amplifier of claim 2, wherein the first level of the common mode voltage causes the first and second pulse-width-modulated output pulses to have zero duty cycle.

4. The amplifier of claim 1, wherein the first level of the common mode voltage causes the first and second pulse-width-modulated output pulses to have zero duty cycle.

5. The amplifier of claim 1, wherein the difference circuitry comprises:
a first adder, receiving the input signal and the feedback signal; and wherein the loop filter comprises:
a loop filter block having an input coupled to receive the amplifier output, and having an output coupled to the first adder; and
a first integrator, having an input coupled to the first adder, for generating an integrated difference signal.

6. The amplifier of claim 5, further comprising:
a second adder at the output of the first integrator;
a reference waveform circuit for generating the reference waveform at an output coupled to the second adder;
wherein the loop filter further comprises:
a second integrator, having a first input coupled to the second adder, and having a second input coupled to the loop filter block, the second integrator having outputs coupled to the first and second comparators.

7. The amplifier of claim 6, wherein the output of the common mode ramp voltage circuitry is coupled to the second adder.

8. The amplifier of claim 7, wherein the first and second summers comprise summing nodes.

9. The amplifier of claim 1, wherein the first and second comparators each comprise a differential input receiving a differential signal corresponding to a sum of the difference signal and the reference waveform, the first and second comparators receiving the differential signal at opposite polarities relative to one another;
and wherein the output of the common mode ramp voltage circuitry is coupled to the differential inputs of the first and second comparators.

10. The amplifier of claim 9, further comprising:
first and second differential transconductance amplifiers, each having an differential input for receiving a differential signal corresponding to the difference signal summed with the reference waveform, and each having a differential output coupled to the differential input of the first and second comparators, respectively, in opposite polarities relative to one another.

11. The amplifier of claim 10, wherein the common mode voltage is a differential voltage.

12. The amplifier of claim 1, wherein the input signal and the feedback signal are differential signals;
wherein the input and feedback signals are each applied to a first summing node to produce a differential difference signal;
wherein the difference circuitry comprises:

a first differential transconductance amplifier having a differential input coupled to the first summing node to receive the differential difference signal, and having a differential output;
wherein the loop filter comprises:
a first integrator, coupled to the differential output of the first differential transconductance amplifier, and having a differential output;
a second differential transconductance amplifier having a differential input coupled to the differential output of the first integrator, and having a differential output; and
a second integrator, coupled to the differential output of the second differential transconductance amplifier, and having a differential output;
and further comprising:
first and second differential transconductance amplifiers, each having an differential input coupled to the differential output of the second integrator, and each having a differential output coupled to the differential input of the first and second comparators, respectively, in opposite polarities relative to one another.

13. The amplifier of claim 1, further comprising:
pulse-width-modulation control logic, having inputs coupled to receive the first and second pulse-width-modulated output pulses, and having first and second outputs coupled to the power stage, for generating active output pulses at its first and second outputs having a pulse width of at least as long as a first selected duration.

14. The amplifier of claim 13, wherein the pulse-width-modulation control logic is also for generating inactive output pulses at its first and second outputs having a pulse width of at least as long as a second selected duration.

15. The amplifier of claim 13, wherein the pulse-width-modulation control logic comprises:
a first one-shot multivibrator, having an input coupled to receive the first pulse-width-modulated output pulse, for generating a pulse at its output of the first selected duration responsive to a transition of the first pulse-width-modulated output pulse;
a first OR function having a first input receiving the first pulse-width-modulated output pulse and having a second input receiving the output of the first one-shot multivibrator, and having an output;
a second one-shot multivibrator, having an input coupled to receive the second pulse-width-modulated output pulse, for generating a pulse at its output of the first selected duration responsive to a transition of the second pulse-width-modulated output pulse; and
a second OR function having a first input receiving the second pulse-width-modulated output pulse and having a second input receiving the output of the second one-shot multivibrator, and having an output.

16. The amplifier of claim 15, wherein the pulse-width-modulation control logic is also for generating inactive output pulses at its first and second outputs having a pulse width of at least as long as a second selected duration;
and further comprising:
a third one-shot multivibrator, having an input coupled to the output of the first OR function, for generating a pulse at its output of the second selected duration responsive to a falling transition at the output of the first OR function;
a first AND function having a first input receiving the output of the first OR function and having a second input receiving the output of the third one-shot multivibrator, and having an output;

a fourth one-shot multivibrator, having an input coupled to receive the output of the second OR function, for generating a pulse at its output of the second selected duration responsive to a falling transition at the output of the second OR function; and a second AND function having a first input receiving the output of the second OR function and having a second input receiving the output of the fourth one-shot multivibrator, and having an output.

17. The amplifier of claim 13, wherein the pulse-width-modulation control logic is also for generating compensating pulses at its second output responsive to generating active pulses at its first output, and for generating compensating pulses at its first output responsive to generating active pulses at its second output.

18. The amplifier of claim 17, wherein the pulse-width-modulation control logic is also coupled to the common mode ramp voltage circuitry, and is for generating the compensating pulses responsive to the common mode voltage exceeding a selected level.

19. The amplifier of claim 18, wherein the pulse-width-modulation control logic is also for generating inactive output pulses at its first and second outputs having a pulse width of at least as long as a second selected duration;

and wherein the pulse-width-modulation control logic is also for generating inactive output pulses at its first and second outputs having a pulse width of at least as long as a second selected duration.

20. The amplifier of claim 19, wherein the pulse-width-modulation control logic comprises:

a first one-shot multivibrator, having an input coupled to receive the first pulse-width-modulated output pulse, for generating a pulse at its output of the first selected duration responsive to a transition of the first pulse-width-modulated output pulse;

a first OR function having a first input receiving the first pulse-width-modulated output pulse and having a second input receiving the output of the first one-shot multivibrator, and having an output;

a second one-shot multivibrator, having an input coupled to receive the second pulse-width-modulated output pulse, for generating a pulse at its output of the first selected duration responsive to a transition of the second pulse-width-modulated output pulse;

a second OR function having a first input receiving the second pulse-width-modulated output pulse and having a second input receiving the output of the second one-shot multivibrator, and having an output;

a third one-shot multivibrator, having an input coupled to the output of the first OR function, for generating a pulse at its output of the second selected duration responsive to a falling transition at the output of the first OR function;

a first AND function having a first input receiving the output of the first OR function and having a second input receiving the output of the third one-shot multivibrator, and having an output;

a fourth one-shot multivibrator, having an input coupled to receive the output of the second OR function, for generating a pulse at its output of the second selected duration responsive to a falling transition at the output of the second OR function;

a second AND function having a first input receiving the output of the second OR function and having a second input receiving the output of the fourth one-shot multivibrator, and having an output.

21. The amplifier of claim 20, wherein the pulse-width-modulation control logic further comprises:

a fifth one-shot multivibrator, having an input coupled to receive the first pulse-width-modulated output pulse, for generating a pulse at its output of a selected duration responsive to a transition of the first pulse-width-modulated output pulse;

a third AND function having a first input coupled to the output of the fifth one-shot multivibrator, having a second input receiving a control signal indicating whether the common mode voltage exceeds the selected level, and having an output coupled to a third input of the second OR function;

a sixth one-shot multivibrator, having an input coupled to receive the second pulse-width-modulated output pulse, for generating a pulse at its output of a selected duration responsive to a transition of the second pulse-width-modulated output pulse; and a fourth AND function having a first input coupled to the output of the sixth one-shot multivibrator, having a second input receiving a control signal indicating whether the common mode voltage exceeds the selected level, and having an output coupled to a third input of the first OR function.

22. A method of generating pulse-width-modulated signals to be applied to a bridged load, comprising the steps of:
receiving an analog input signal;
filtering a feedback signal corresponding to the pulse-width-modulated signals with a loop filter;
combining the analog input signal with the filtered feedback signal to generate a difference signal;
combining a periodic reference waveform with the difference signal;
generating a first pulse-width-modulated signal responsive to the combined signals;
generating a second pulse-width-modulated signal, complementary to the first pulse-width-modulated signal, responsive to the combined signals; and
responsive to a muting control signal, applying a common mode voltage to the combined signals ramping from zero common mode voltage to a first level, so that the generating steps generate the first and second pulse-width-modulated signals of decreasing duty cycle.

23. The method of claim 22, further comprising:
responsive to an unmuting control signal, applying a common mode voltage to the combined signals ramping from the first level to zero common mode voltage, so that the generating steps generate the first and second pulse-width-modulated signals of increasing duty cycle.

24. The method of claim 23, wherein the common mode voltage at the first level causes the first and second pulse-width-modulated signals of zero duty cycle.

25. The method of claim 22, wherein the common mode voltage at the first level causes the first and second pulse-width-modulated signals of zero duty cycle.

26. The method of claim 22, further comprising:
responsive to each rising edge of the first pulse-width-modulated signal, generating a first active signal having a pulse width corresponding to the longer of the pulse width of the first pulse-width-modulated signal or a first selected duration; and
responsive to each rising edge of the second pulse-width-modulated signal, generating a second active signal having a pulse width corresponding to the longer of the pulse width of the second pulse-width-modulated signal or the first selected duration.

27. The method of claim 26, further comprising:
responsive to each falling edge of the first pulse-width-modulated signal, generating a first inactive signal having an inactive pulse width corresponding to the longer of the inactive width of the first pulse-width-modulated signal or a second selected duration; and
responsive to each falling edge of the second pulse-width-modulated signal, generating a second inactive signal having an inactive pulse width corresponding to the longer of the inactive width of the second pulse-width-modulated signal or the second selected duration.

28. The method of claim 22, further comprising:
responsive to each rising edge of the first pulse-width-modulated signal in combination with the common mode voltage exceeding a selected level, the first pulse-width-modulated signal associated with a first output half-bridge, generating a second active signal associated with a second output half-bridge, and having a third selected duration; and
responsive to each rising edge of the second pulse-width-modulated signal in combination with the common mode voltage exceeding the selected level, the second pulse-width-modulated signal associated with the second output half-bridge, generating a first active signal associated with the first output half-bridge, and having the third selected duration.

\* \* \* \* \*